(12) United States Patent
Jones et al.

(10) Patent No.: US 11,041,358 B2
(45) Date of Patent: Jun. 22, 2021

(54) CHEMICALLY BONDED COATED METAL-TO-METAL SEALS

(71) Applicant: Halliburton Energy Services, Inc., Houston, TX (US)

(72) Inventors: Christopher Michael Jones, Katy, TX (US); Darren Gascooke, Houston, TX (US); James M. Price, The Woodlands, TX (US); Michael T. Pelletier, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 128 days.

(21) Appl. No.: 15/762,541

(22) PCT Filed: Nov. 30, 2015

(86) PCT No.: PCT/US2015/062910
§ 371 (c)(1),
(2) Date: Mar. 22, 2018

(87) PCT Pub. No.: WO2017/095361
PCT Pub. Date: Jun. 8, 2017

(65) Prior Publication Data
US 2019/0078418 A1    Mar. 14, 2019

(51) Int. Cl.
*E21B 34/06*      (2006.01)
*F16K 25/00*      (2006.01)
(Continued)

(52) U.S. Cl.
CPC .......... *E21B 34/06* (2013.01); *C23C 14/0611* (2013.01); *C23C 16/26* (2013.01);
(Continued)

(58) Field of Classification Search
CPC ....................................................... E21B 34/06
See application file for complete search history.

(56) References Cited

U.S. PATENT DOCUMENTS

| 5,364,110 A | 11/1994 | Streich et al. |
| 6,508,453 B2 | 1/2003 | Mamyo |

(Continued)

FOREIGN PATENT DOCUMENTS

WO    WO-2014/042622 A1    3/2014

OTHER PUBLICATIONS

EPI Inc., "Hydrodynamic Bearings," retrieved on Nov. 25, 2015 from http://www.epi-eng.com/piston_engine_technology/engine_bearings.htm, 11 pages.
(Continued)

*Primary Examiner* — Tara Schimpf
*Assistant Examiner* — Dany E Akakpo
(74) *Attorney, Agent, or Firm* — Gilliam IP PLLC

(57) ABSTRACT

Oilfield tools having a metal-to-metal seal formed between a first metal surface and a second metal surface, wherein at least one of the first and second metal surfaces are at least partially coated by chemical bonding or physical deposition of a coating material that is more durable and has a lower coefficient of friction than either or both of the first and/or second metal surfaces to which the coating material is applied.

23 Claims, 3 Drawing Sheets

(51) Int. Cl.
*F16J 15/08* (2006.01)
*F16K 5/06* (2006.01)
*C23C 14/06* (2006.01)
*C23C 16/26* (2006.01)
*C23C 16/40* (2006.01)
*C23C 16/455* (2006.01)

(52) U.S. Cl.
CPC ...... *C23C 16/403* (2013.01); *C23C 16/45525* (2013.01); *F16J 15/0806* (2013.01); *F16K 5/0657* (2013.01); *F16K 25/005* (2013.01); *E21B 2200/04* (2020.05)

(56) References Cited

U.S. PATENT DOCUMENTS

| | | | |
|---|---|---|---|
| 6,863,130 | B2 | 3/2005 | Steele et al. |
| 8,727,315 | B2 | 5/2014 | Ringgenberg |
| 2011/0168454 | A1* | 7/2011 | Keshavan ............. C22C 29/005 |
| | | | 175/428 |
| 2012/0298901 | A1 | 11/2012 | Ringgenberg |
| 2013/0320665 | A1* | 12/2013 | Gard .................... C10M 107/32 |
| | | | 285/94 |
| 2014/0178637 | A1 | 6/2014 | Rajagopalan et al. |
| 2016/0251903 | A1* | 9/2016 | Schroder ................ E21B 10/46 |
| | | | 175/371 |

OTHER PUBLICATIONS

Mraz, "The meaning of bearing life," Machine Design, Apr. 2007, retrieved from http://machinedesign.com/print/bearings/maening-bearing-life, 4 pages.

The Enginering Tool Box, Highest TC Diamond, retrieved on Nov. 25, 2015 from http://www.engineeringtoolbox.com/friction-coefficients-d_778.html, 5 pages.

International Search Report and Written Opinion from PCT/US2015/062910, dated Aug. 29, 2016, 15 pages.

* cited by examiner

CHEMICALLY BONDED COATED METAL-TO-METAL SEALS

BACKGROUND

The present disclosure generally relates to tools for use in oilfield operations, and more particularly, to metal-to-metal seals coated by chemically bonding a durable material to a surface of the metal forming the metal-to-metal seal.

Sealing of components in oilfield operations is of critical importance, both during the operation of downhole tools and for use in portions of the tools that remain in the well after completion, testing, and production. For example, valve seals require maintenance of hydraulic isolation under a pressure differential. Such seals have traditionally been elastomeric, where the elastomer composition of the seal is resilient and thus is able to conform to opposing surfaces and maintain sealing integrity even in a dynamic condition. However, elastomeric seals have difficulty surviving hostile conditions, such as those encountered downhole, or during dynamic movement of a tool contacting the elastomeric seals. Elastomeric seals are often susceptible to loss in resiliency, swelling, peeling, cracking, shape deformation, and the like, based on various factors such as chemical compatibility, temperature, pressure, mechanical wear, and the like.

Metal-to-metal seals were developed to replace or supplement elastomeric seals in oil and gas operations because they are less affected by downhole environmental conditions (e.g., downhole chemicals, temperatures, pressures, and the like). As used herein, the term "metal-to-metal seal" refers to any seal formed substantially by contact between at least two metal materials, either identical or different in composition, such that the metal portions (e.g., surfaces) of the seal form the primary sealing mechanism. Such seals encounter either or both of static or dynamic conditions, where one or more surfaces contacting the seal is either nonmoving or moving, respectively. However, when metal-to-metal seals are used in dynamic conditions (e.g., portions of tools having moving parts, such as sliding closures or openings), they often experience metal-to-metal abrasion that limits the lifetime of the metal-to-metal seal. Even metal-to-metal seals meant to be static can experience micro movements due to vibration and can experience friction upon assembly. To maintain large pressure differentials often found in the oilfield industry, the seal is loaded with a large force. The total friction then of the moving system is large due to the large force component. This can result in significant wear for these components and hence shorter lifetimes than seals that use elastomeric components.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
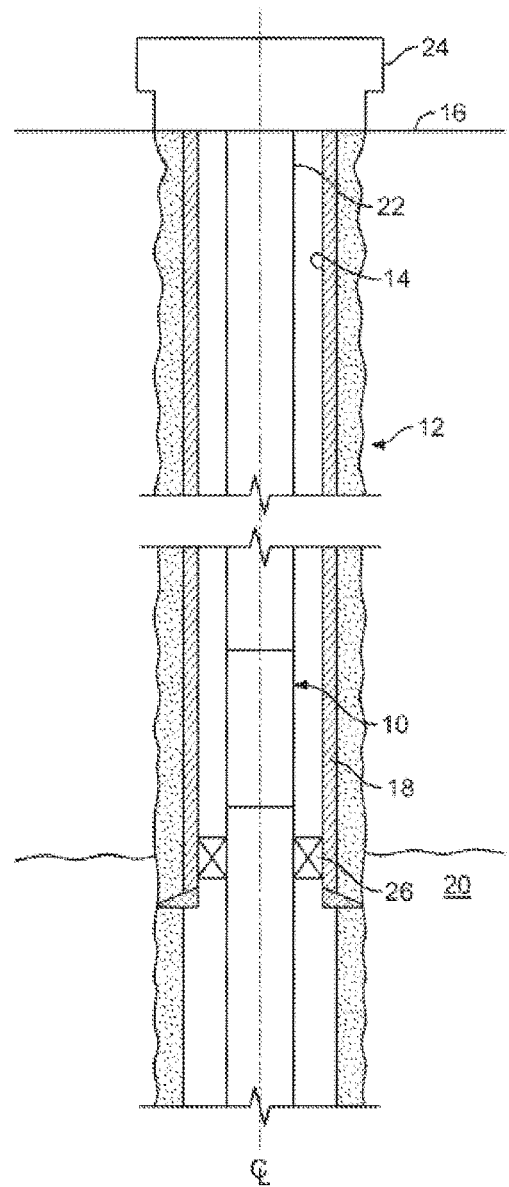
FIG. 1 illustrates a schematic side view of a ball valve having a metal-to-metal seal in a well system.

The present disclosure generally relates to tools for use in oilfield operations, and more particularly, to metal-to-metal seals coated by chemically bonding a durable material to a surface of the metal forming the metal-to-metal seal. The coated material is either equally or more durable than the substrate (i.e., at least a portion of the metal-to-metal seal) and has a lower coefficient of friction for the system (i.e., the functionality of the metal-to-metal seal and/or the tool in which it is included). That is, in one embodiment the material is at least as durable as the substrate and lowers the coefficient of friction for the sealed system. In another embodiment, the coating is sufficiently durable for the particular operational application and lowers the coefficient of friction for the sealed system. As a specific example, the present disclosure uses atomic layer deposition (ALD) to coat metal-to-metal seals. The coatings formed on the metal-to-metal seals may be partially or fully applied to one, some, or all of the metal surfaces forming the metal-to-metal seal, without departing from the scope of the present disclosure. Accordingly, the term "metal-to-metal seal" used in conjunction with the term "coating," as described below, does not imply complete coating.

Metal-to-metal seals are often used where elastomeric seals are unfeasible due to environmental or application conditions, such as high temperatures or pressures, chemical resistance, prevention of outgassing, radiation, gas permeability, and the like. However, metal-to-metal seals, particularly under dynamic conditions, experience frictional and/or compressive forces that erode or wear away the seals, which may result in sealing failure. Reducing such frictional forces of metal-to-metal seals can thus result in an increased potential lifetime of the seal. For example, by reducing the coefficient of friction, the lifetime of the seal can be extended.

For example, a "Stribeck Curve," sometimes known as a "ZN/P curve" or a "nN/p curve," illustrates typical bearing performance under varying conditions of operation. Three operational ranges are depicted in the ZN/P curve. The x-axis of the ZN/P curve is directly related to the lifetime of the bearing. The first operational range represents high frictional forces, shown as high coefficients of friction, and the lifetime of the bearing is reduced. However, as the coefficient of friction is reduced dramatically in the second operational range, the lifetime of the bearing is extended. Accordingly, by reducing the coefficient of friction or frictional forces experienced by metal-to-metal contact areas, the lifetime of the tool should be increased.

Indeed, increased clean lubrication resulting in a decreased coefficient of friction can increase the life of a component (e.g., a bearing or valve seal). Alternatively, the life of a component is hindered where contaminated and/or bad lubrication increases the coefficient of friction. For very good lubrication, the lifetime of the component can be extended to an extent better than a linear relationship.

One or more illustrative embodiments disclosed herein are presented below. Not all features of an actual implementation are described or shown in this application for the sake of clarity. It is understood that in the development of an actual embodiment incorporating the embodiments disclosed herein, numerous implementation-specific decisions must be made to achieve the developer's goals, such as compliance with system-related, lithology-related, business-related, government-related, and other constraints, which vary by implementation and from time to time. While a developer's efforts might be complex and time-consuming, such efforts would be, nevertheless, a routine undertaking for those of ordinary skill in the art having benefit of this disclosure.

It should be noted that when "about" is provided herein at the beginning of a numerical list, the term modifies each number of the numerical list. In some numerical listings of ranges, some lower limits listed may be greater than some upper limits listed. One skilled in the art will recognize that the selected subset will require the selection of an upper limit in excess of the selected lower limit. Unless otherwise indicated, all numbers expressed in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the exemplary embodiments described herein. At the very least, and not as an attempt to limit the application of the doctrine of equivalents to the scope of the claim, each numerical parameter should at least be construed in light of the number of reported significant digits and by applying ordinary rounding techniques.

While compositions and methods are described herein in terms of "comprising" various components or steps, the compositions and methods can also "consist essentially of" or "consist of" the various components and steps. When "comprising" is used in a claim, it is open-ended.

The use of directional terms such as above, below, upper, lower, upward, downward, left, right, uphole, downhole and the like are used in relation to the illustrative embodiments as they are depicted in the figures, the upward direction being toward the top of the corresponding figure and the downward direction being toward the bottom of the corresponding figure, the uphole direction being toward the surface of the well and the downhole direction being toward the toe of the well.

The metal-to-metal seals described herein are coated with a material that is more durable than the substrate and has a lower coefficient of friction. As used herein, the term "chemical coating," and grammatical variants thereof, refers to a layer formed by chemical bonding to a substrate, either the substrate itself or a seed layer, as described below. The terms "chemical coating" and "chemical bonding" are thus used interchangeably herein. "Physical coating" refers herein to a layer formed by physical deposition to a substrate (e.g., adhesion). The terms "physical coating" and "physical deposition" are thus used interchangeably herein. Suitable chemical and/or physical coating for metal-to-metal seals is generally greater than 1.2 nm, but not excessively thick such that the metal-to-metal seal, or tool, tolerance is compromised. That is, the chemical and/or physical coating can be only so thick as to ensure that the metal-to-metal seal remains within designed seal tolerance(s) (e.g., to maintain proper sealing, compression, contact, etc.), which varies based on the type of seal, the type of tool employing the seal, the downhole environment, and the like, and any combination thereof. In other embodiments, the chemical and/or physical coating material is coated partially or fully onto one or more or all surfaces of a metal-to-metal seal in order to achieve the seal tolerance of the metal-to-metal seal. That is, the metal-to-metal seal itself may be designed such that it does not achieve the seal tolerance until one or more physical and/or chemical coatings are applied, which further have the benefits described herein.

When the chemical and/or physical coating is relatively thin, the resultant seal can beneficially allow for increased flexibility, another useful characteristic for durability. The term "durable," and grammatical variants thereof, refers to a measured resistance to physical deformation or chemical degradation (referred to collectively herein as "durable," and grammatical variants thereof), as well as the ability to withstand pressure and/or damage during a particular operational application. Generally, the durability of the chemically coated material onto the metal-to-metal seals is more durable than the material forming the metal-to-metal seal. Durability can be quantified using Young's modulus or Poisson's ratio, although other application dependent measures can be appropriate, without departing from the scope of the present disclosure. Durability can be measured using Vickers hardness, Knoop hardness, nanoindentation hardness, and the like, for example. Chemical durability provides chemical resistance to degradation. The parameter of durability of importance is often defined by the specific operational application or environment of the application. For instance, in an inert environment, a chemical durability may not be a parameter of importance; however, in a corrosive environment, chemical durability is very important. Likewise, if the operation application results in high shock or stress, then pliability may be of particular importance. The durability of the system for an at least partially coated surface may be higher than that of the metal surface alone (without coating), but not as high as the coating material alone. Further, the durability of the system for an at least one partially coated surface may be higher for the system than either of the metal surface alone or the coating alone (i.e., the coating and the surface synergistically increase the durability).

The "substrate" is the material forming the metal-to-metal seal, and the "coefficient of friction" refers to the ratio of the tangential force that is needed to start or to maintain relative motion between two contacting surfaces to the perpendicular force holding them in contact. There are dynamic and static estimations of the coefficient of friction, any of which may be applicable to a specific application. The coated material accordingly imparts a reduced coefficient of friction to the metal-to-metal seal to which it is chemically bonded. The coefficient of friction of the chemically coated material onto the metal-to-metal seals is preferably less than the coefficient of friction of glass (about 1), but depends on the material forming the metal-to-metal seal.

Suitable coatings may be achieved by various methods including wet chemistry, electrochemical reaction, or solid fusion. Additionally, the chemical (or physical) deposition can be achieved by chemical vapor deposition, including ALD, as described in more detail below, electron beam deposition, magnetron sputtering deposition, and the like. Annealing may take a physical deposition and enhance to a chemical bond. These various methods may be used to apply coatings (e.g., chemical and/or physical coatings) such as $Al_2O_3$, diamond, silicon nitride, or silicon carbide, all of which may be useful coatings to achieve desired characteristics, as described herein.

In an embodiment, the metal-to-metal seals described herein are chemically coated by ALD with aluminum oxide ($Al_2O_3$) or crystalline forms thereof (e.g., sapphire, which is identical in chemical form to $Al_2O_3$) (collectively referred to as "aluminum oxide"), either natural or synthetic, for increased lifetime, particularly under dynamic conditions. In another embodiment, the metal-to-metal seals described herein are coated (e.g., chemically coated) with diamond (e.g., by chemical vapor deposition), either natural or synthetic, for increased lifetime, particularly under dynamic conditions. It is to be appreciated that while the metal-to-metal seals of the present disclosure are described herein primarily with reference to ALD-coated aluminum oxide metal-to-metal seals, any coated material that is both more durable than the substrate forming the metal-to-metal seal and that has a lower coefficient of friction may be otherwise chemically bonded or deposited onto the metal-to-metal seals in accordance with the embodiments herein, without departing from the scope of the present disclosure. Examples of suitable materials which can be deposited by various methods include, but are not limited to, diamond, diamond-like carbon (DLC), silicon nitride, silicon carbide, titanium oxide, hafnium(IV) oxide, zirconium oxide, beryllium oxide, and the like, any in combination with aluminum oxide, and any combination thereof.

In some embodiments, a seed layer (e.g., a transition material) may be required to prepare the metal-to-metal seal to receive the coating material. For example, a metal-to-metal seal may be prepared (e.g., coated) initially with a layer of silicon carbide or silicon nitride, followed by the deposition of the coating material (e.g., diamond). In some instances, a seeding layer may be necessary to promote the growth of the material to be chemically coated onto the metal substrate. As used herein, the term "seed layer" refers to a layer deposited directly onto the substrate, prior to the desired chemical coating layer, in order to improve the bonding characteristics of the chemical coating. One example is diamond, which does not bond well with metal. In this case, a seed layer of silicon carbide (SIC), for example, is first deposited onto the substrate, and then followed by the desired material for chemical coating (e.g., diamond). Accordingly, in some embodiments, there may be a need for at least one seed layer. Other benefits and/or requirements of a seed layer include, but are not limited to, chemical compatibility with the substrate, providing a stress relief layer (e.g., when the two lattice constants do not match and cause considerable stress in the material to be chemically coated), providing an isolation barrier (e.g., a gas diffusion barrier), and the like, and any combination thereof.

The metal-to-metal seals described herein include any metal-to-metal seals for use in an oilfield operations, including for use in surface equipment and downhole tools. As used herein, the term "tool" will encompass both surface equipment and downhole tools used in oilfield operations. Such metal-to-metal seals include, but are not limited to, threadedly engaged metal-to-metal seals, O-ring metal-to-metal seals, C-ring metal-to-metal seals, spring energized metal-to-metal seals, L-seal metal-to-metal seals, E-seal metal-to-metal seals, wire-ring pressurized metal-to-metal seals, U-ring metal-to-metal seals, ball valve metal-to-metal seals, flat planar sliding metal-to-metal seals (e.g., for use in a hostile formation tester), and the like, and any combination thereof. Examples of oilfield tools that employ such metal-to-metal seals include, but are not limited to, formation testers (e.g., high pressure, high temperature sequential formation testers, the HSFT-II™ formation tester, available from Halliburton Energy Services, Inc. in Houston, Tex.), valves, pumps, and the like. Examples of oilfield operations that employ the tools comprising the metal-to-metal seals include, but are not limited to, drill stem testing, formation testing (wireline or logging while drilling), and the like. Surface equipment, including pipelines, also make use of metal-to-metal seals.

"Atomic layer deposition" or "ALD" is a thin film deposition technique based on the sequential use of a gas phase chemical process. ALD provides film coating depositions that are chemically bound and the deposited films are relatively thin and on the order of single nanometers to many micrometers (μm) thick, provided that they do not compromise required seal tolerance(s). The chemical deposition employed by ALD differs from physical deposition techniques, which are characterized by weaker forces adhering the coating to a substrate material. Accordingly, a metal-to-metal seal coating formed using ALD results in a more effective coating and a longer lasting coating than by physical deposition means. Other coating techniques may result in thicknesses from single nanometers thick to hundreds of μm thick.

Aluminum oxides (including its crystalline forms such as sapphire) have a particularly low coefficient of friction, as shown in Table 1 below, compared to other materials and is effective at being deposited on substrates using ALD. Such substrates include, but are not limited to, titanium, stainless steel (e.g., stainless steel SWAGELOK® valves and fittings), and MP35N® alloy (from Standard Pressed Steel Technologies, Inc. in Jenkintown, Pa.) with HASTELLOY® (from Haynes International in Kokomo, Ind.) and beryllium-copper, for example. Table 1 shows the coefficients of static friction for combinations of Material I and Material II.

TABLE 1

| Materials and Material Combinations | | Static Frictional |
|---|---|---|
| Material I | Material II | Coefficient (μ) |
| Aluminum | Aluminum | 1.05-1.35 |
| Aluminum-bronze | Steel | 0.45 |
| Aluminum | Mild Steel | 0.61 |
| Brake material | Cast iron | 0.4 |
| Brass | Steel | 0.35 |
| Cast Iron | Cast Iron | 1.1 |
| Carbon (hard) | Carbon | 0.16 |
| Copper | Mild Steel | 0.53-0.36 |
| Diamond | Diamond | 0.1 |
| Diamond | Metal | 0.1-0.15 |
| Glass | Glass | 0.9-1.0 |
| Graphite | Graphite | 0.1 |
| Iron | Iron | 1 |
| Magnesium | Magnesium | 0.6 |
| Masonry | Brick | 0.6-0.7 |
| Nickel | Nickel | 0.7-1.1 |
| Nickel | Mild Steel | 0.64 |
| Nylon | Nylon | 0.15-0.25 |
| Silver | Silver | 1.4 |
| Sapphire | Sapphire | 0.2 |
| Sapphire | Steel | 0.1-0.15 |
| Steel | Steel | 0.5-0.8 |
| Teflon | Teflon | 0.04 |
| Zinc | Cast Iron | 0.85 |
| Zinc | Zinc | 0.6 |

As shown, sapphire has a static coefficient of friction of 0.2, which can be harnessed to increase the lifetime of a metal-to-metal seal by forming a coating thereabout or thereon. Moreover, sapphire is only second in hardness compared to diamond and, thus, the durability of a sapphire (or aluminum oxide) coating on a metal-to-metal seal not only results in a coefficient of friction reduction but also in enhanced durability. Sapphire is about 1800 units as measured by Knoop hardness. As discussed above, coating by ALD results in a chemically bound coating that has far superior material adhesion compared to physical coating methods. Additionally, because ALD results in a thin film coating, it is significantly more pliable and or flexible than thicker coatings which may suffer from brittle failure and, thus, conforms more readily to the underlying substrate (e.g., the outer surface of a metal-to-metal seal) without delamination (again extending coating lifetime). Moreover, ALD can deposit thin coatings on non-planar substrates and is not restricted by "line-of-sight" deposition.

The embodiments herein relate to metal-to-metal seals that have been coated with an aluminum oxide using a specific ALD methodology. In the ALD methodology used herein, under high vacuum, reactant chemicals are used for forming an aluminum oxide film on the surface of a substrate (i.e., a metal-to-metal seal) and have a process temperature window. In some instances, that process temperature window ranges from about 22° C. to about 300° C., encompassing any value and subset therebetween, although windows outside of this range may be used depending on the conditions of the particular ALD methodology. The reaction is designed in a way to be self-limiting such that only one atomic layer is deposited per deposition cycle. The deposition process occurs at low pressure in a gas phase and, accordingly, the coverage onto and into areas of a substrate (i.e., uniform and non-planar structures) is very regular, and reaches into tight or small areas (e.g., crevices, treaded surfaces, and the like) to conform to the exact shape of the underlying substrate on an atomic scale Specifically, in some embodiments, the deposition of an aluminum oxide using the ALD methods described herein includes introducing a first gaseous compound, termed a "first precursor," into an ALD reaction chamber. Examples of suitable precursors include, but is not limited to, trimethylaluminum and tris(diethylamino)ammonium. Such precursors are not used simultaneously. The precursor is chemically bound to the substrate (e.g., a surface of a metal-to-metal seal). Next, the ALD reaction chamber is purged (evacuated) to remove any non-reacted first precursors and/or gaseous reaction by-products of the first precursors. Thereafter, a "second precursor" is introduced into the ALD reaction chamber to chemically react the substrate-bounded first precursor to form an aluminum oxide monolayer. Suitable second precursors include, but are not limited to, de-ionized water and ozone. Such precursors are not used simultaneously. Next, the ALD reaction chamber is again purged (evacuated) to remove any non-reacted second precursors and/or gaseous reaction by-products of the second precursors. The foregoing is then repeated until the desired number of layers and the desired thickness of the layers is achieved.

The ALD process results in inherent self-terminating reactions and, thus, is characterized as a self-controlled process, where the predominant process parameters of control include the precursor types and their flow rates, the substrate, and the ambient temperature and pressure inside of the ALD reaction chamber. Because of such inherent self-control, the resultant aluminum oxide layers described herein are deposited onto the substrate (e.g., a surface of a metal-to-metal seal) in extremely conformational and otherwise uniform thickness on the surface of the substrate (e.g., on multiple sides thereof).

By way of example, testing aluminum oxide deposition according to the embodiments described herein on a metal-to-metal valve seal of an HSFT-II™ has revealed that a desired coating thickness of 500 nanometers may be achieved in about a 14 hour period, although such duration may change slightly based on the exact chemistry being deposited. The deposition layer of aluminum oxide may be 500 nm, or in other embodiments, the deposition layer of the aluminum oxide (or any other chemically deposited material described herein) is in the range of about 1.2 nm to about 3000 nm, or even greater provided that seal tolerance(s) is not compromised. In some embodiments, the aluminum oxide ALD coating described herein may be further supplemented with a layer of another desirable material at any location in the coating to increase durability by chemical bonding or deposition (including ALD-coating if appropriate), without departing from the scope of the present disclosure. Such additional coatings can be one or more layers, and can be seed and/or laminate layers. As used herein, the term "laminate layer" refers to coating of a material (e.g., the durable coating materials described herein) in multiple layers (greater than two), so that the multilayered material achieves improved strength, stability, or other properties. These one or more layers may be coated consecutively, alternatingly, or sandwiched between one or more chemical and/or physical coatings with the durable material described herein, without departing from the scope of the present disclosure.

Referring now to FIG. 1, illustrated is a schematic side view of a tool assembly, and specifically a ball valve 10 having a metal-to-metal seal (shown in 2A and 2B), extending in a well system (e.g., into a subterranean formation). It will be appreciated that tool assemblies may be conveyed into the well system using (e.g., through or physically connected to) a tubular string, such as a drill string. The metal-to-metal seal of the ball valve can be coated according to the embodiments described herein to, among other things, reduce the coefficient of friction and increase the lifetime of the seal and components comprising the seal. The ball valve 10 of FIG. 1 may be used in a variety of applications in downhole tools including, but not limited to, formation testers (e.g., an HSFT-II™), safety valves, and the like. When a formation tester is used as the tool assembly, it may be deployed in a tubular string, as described herein. The formation tester may be conveyed using a wireline (e.g., physically connected to), in some embodiments. Such formation testers can be deployed as part of a production system for determining one or more characteristic of the formation (e.g., fluid samples content, pressure, porosity, and the like).

Referring to FIG. 1, a ball valve 10 is shown in a well system 12. The well system 12 includes a wellbore 14 that extends from a surface location 16 into a subterranean formation 20, and when completed, the well system 12 produces reservoir fluids and/or injects fluids into one or more zones in the subterranean formation 20. In certain instances, the wellbore 14 is lined with casing 18, which may or may not be cemented in place with cement. The ball valve 10 is shown in a tubing string 22 that extends from a wellhead 24 of the well system 10. The ball valve 10 is in a generally cylindrical configuration, and may have a diameter approximately equal to the inner diameter of the tubing string 22 and lack elements that protrude radially outward, so that the ball valve 10 can pass smoothly through a cylindrical tubing string 22.

The tubing string 22 may be any type of conveyance tubing suitable for use in a subterranean formation, such as a coiled tubing and/or a string of jointed tubing coupled end-to-end. In certain instances, the tubing string 22 may be a drill string, a working string, and/or a production/injection string. For example, the ball valve 10 may be used in the context of drill stem testing. In drill stem testing, the tubing string 22 is a drill string constructed of drill pipe or other working string and is sealed to the casing 18 with a packer 26 to isolate a subterranean zone below the packer 26. Thereafter, the subterranean zone below the packer 26 can be pressurized or depressurized and the pressure behavior of the subterranean zone observed. Other example contexts in which the ball valve 10 can be used include formation sampling, as a safety valve and/or other operations.

Figure 2A:
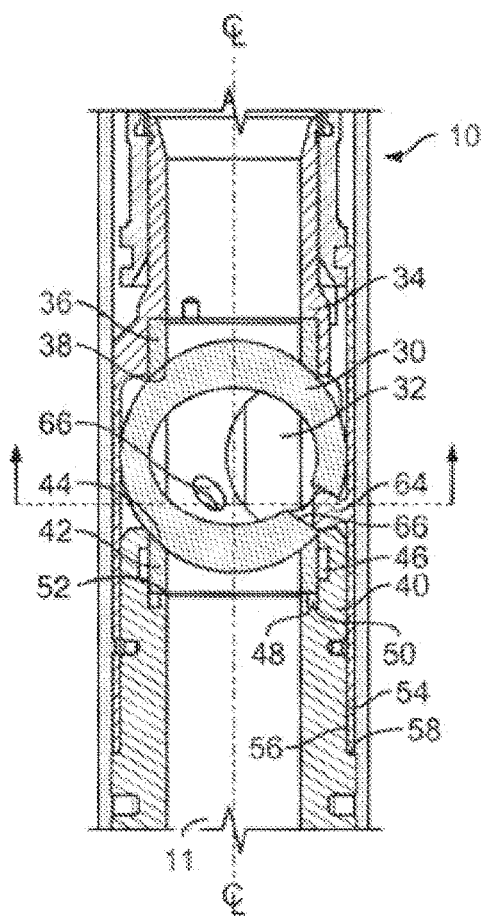
FIGS. 2A and 2B illustrate a side cross-section view of a ball valve having a metal-to-metal seal.
Figure 2B:
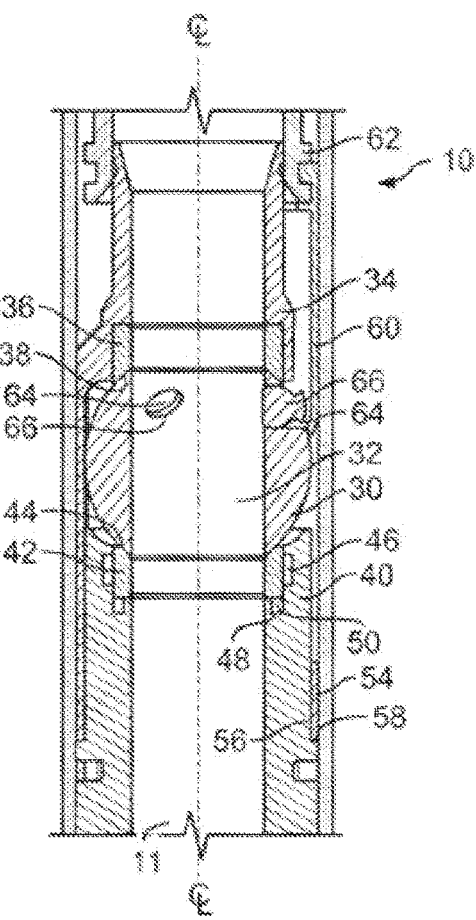

Referring now to FIGS. 2A and 2B, with continued reference to FIG. 1, the ball valve 10 is shown in side cross-section. As shown in FIG. 2A, the ball valve 10 has a cylindrical central flow bore 11 that runs axially through the valve 10. The central flow bore 11 is adapted to circumferentially align with and communicate fluid with a central flow bore of the remainder of the tubing string (e.g., tubing string 22 of FIG. 1) in which the ball valve 10 may be installed. The ball valve 10 has a substantially spherical ball 30 that has its own cylindrical central flow bore 32 therethrough. When the valve 10 is open, the cylindrical central flow bore 32 is a part of the central flow bore 11, and is circumferentially aligned with and communicates fluids with the remainder of the central flow bore 11.

The ball 30 is clamped between two clamping assemblies. One clamping assembly includes a generally cylindrical ball cage 34 that carries a seat ring 36. The seat ring 36 has a seat surface 38 in contact with a spherical exterior surface of the ball 30. The second clamping assembly includes a generally cylindrical seat ring holder 40 that carries a second, sealing seat ring 42 having a sealing seat surface 44 in contact with the spherical exterior surface of the ball 30. The tubular ball cage 34 includes a cage portion that extends around the ball 30 and threadingly engages to the seat ring holder 40 to clamp the seat rings 36, 42 to and hold the seat surfaces 38, 44 in contact with the exterior surface of the ball 30. For example, as shown in FIG. 2B, the seat ring holder 40 has male threads 54 on its exterior that mate with and are internally received in female threads 56 on the interior of the ball cage 34. Other means of engagement may additionally be used, without departing from the scope of the present disclosure. The ball 30 and other components are metal. The metal sealing seat ring 42 enables a metal-to-metal liquid tight (substantially or entirely liquid tight), and in certain instances gas tight (substantially or entirely gas tight), seal against the exterior surface of the ball 30. Accordingly, the metal-to-metal seals described herein have at least two metal components each having a surface, wherein the metal-to-metal seal is formed by contact between the at least two metal surfaces. The outer diameter of the sealing seat ring 42 is also sealed (substantially or entirely) to an inner diameter of the seat ring holder 40 with an elastomeric seal 46. This elastomer seal 46 and the metal-to-metal seal between the sealing seat ring 42 and the exterior of the ball 30 seal against passage of fluid past the exterior of the ball 30.

The seat ring holder 40 defines an annular pocket 48 that is open towards the sealing seat ring 42. The pocket 48 contains a springing member 50 that reacts against the sealing seat ring 42 and the base of the pocket 48 to springingly bias the sealing seat ring 42 into the ball 30. The springing member 50 maintains the sealing seat ring 42 in contact with the ball 30 over thermal expansion/contraction and flexure of the various components. In certain instances, the springing member 50 is one or more annular springs (e.g., wave spring, Bellville spring, coil spring, polymer ring, and/or other spring). The seat ring holder 40 adjacent the pocket 48 has a shoulder 52 that faces the sealing seat ring 42 and protects the springing member 50. The depth of the pocket 48, measured axially from this shoulder 52 to the base of the pocket 48, is less than the free, uncompressed height of the springing member 50 and greater than the set height of the springing member 50 (i.e., the compressed height at which the springing member 50 deforms). Therefore, the sealing seat ring 42 will abut and rest on the shoulder 52, rather than over compress, and over stress, the springing member 50.

Referring now to FIG. 2B, the valve ball 30 is in a fully open position with the flow bore 32 aligned with the remainder of the flow bore 11, including the respective bores of the ball cage 34 and seat ring holder 40, as well as the remainder of the tubing string 22 (FIG. 1). In the open position, the ball valve 10 allows flow through the ball valve 10 and through the tubing string.

The ball 30 is changed between a closed and an open position by axially shifting a ball operating assembly. The ball operating assembly includes a plurality of ball arms 60 that are coupled to the ball 30 and move in unison by an annular ball arm connector 62. The ball arms 60 (two shown, but fewer or more can be used, without departing from the scope of the present disclosure) each include a knuckle 64 that is received in a receptacle 66 in the exterior of the ball 30. The receptacles 66 are arranged on one side of the ball 30 and on either side of the flow bore 32. The ball arm connector 62 is received over and sealed to the ball cage 34 to shift axially relative to the ball cage 34. The ball arms 60 reside in elongate axial openings 68 in the cage 34. When the ball arm connector 62 is shifted axially from the position in FIG. 2A to the position in FIG. 2B (toward downhole in the illustrated configuration) the ball arms 60 roll the ball 30 to the fully open position. When ball arm connector 62 is shifted axially from the position in FIG. 2B to the position in FIG. 2A (toward uphole in the illustrated configuration), the ball arms 60 roll the ball 30 to the closed position.

Figure 3:
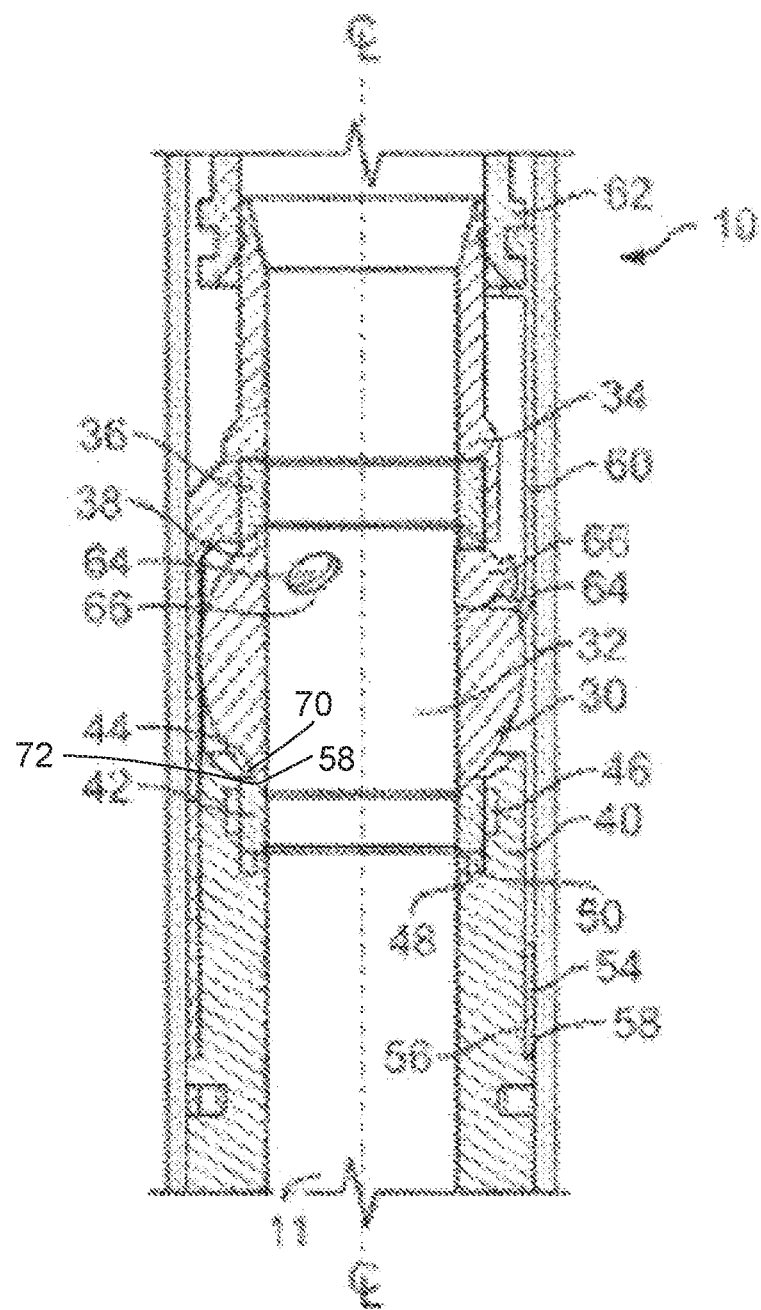
FIG. 3 illustrates a metal-to-metal seal of a ball valve formed between first and second metal surfaces.

Any or all of the components of the ball 30 and the ball operating assembly may be chemically coated a durable material, as described herein, such as by ALD-coating with an aluminum oxide. For example, all or part of the outer surface of the ball 30, the ball cage 34, the seat ring 36, the seat surface 38, the seat ring holder 40, the sealing seat ring 42, the sealing seat surface 44, the annular pocket 48, the springing member 50, and/or the shoulder 52 are ALD-coated with an aluminum oxide. In other embodiments, separate or together with the components listed above, all or part of the ball arms 60 and/or the ball arm connector 62 are ALD-coated with an aluminum oxide. In preferred embodiments, at least the ball 30 and the sealing seat ring 42 are ALD-coated with an aluminum oxide, although other components, as described herein, may additionally be ALD-coated with an aluminum oxide, without departing from the scope of the present disclosure. The components forming the metal-to-metal seal or moving components associated therewith may thus be at least partially or wholly ALD-coated about their surfaces with an aluminum oxide. As used herein, the term "at least partially coated," and grammatical variants thereof (e.g., "at least partially ALD-coated"), means that at least the portion of the surface of the component that contacts another component is coated with a coating material as defined herein by chemical bonding or physical deposition. Moreover, a metal-to-metal seal substrate has at least a first metal surface and a second metal surface that contact one another (i.e., to form a seal) and either one or both of such surfaces can be at least partially coated in accordance with the embodiments described herein. FIG. 3, which depicts the ball valve of FIG. 2B, depicts an example in which a metal-to-metal seal is formed between a surface 58 of the ball 30 and the sealing seat surface 44 of the sealing seat ring 42. At least one of the sealing seat surface 44 and the surface 58 can be coated with a coating material as described herein. For instance, as depicted in FIG. 3, the surface 58 and the sealing seat surface 44 are coated with coating material 70, 72, respectively.

Embodiments disclosed herein include Embodiment A, Embodiment B, and Embodiment C:

Embodiment A

An oilfield tool, comprising: a metal-to-metal seal formed between a first metal surface and a second metal surface, wherein at least one of the first and second metal surfaces are at least partially coated by chemical bonding or physical deposition of a coating material that is more durable and has a lower coefficient of friction than either or both of the first and/or second metal surfaces to which the coating material is applied.

Embodiment A may have one or more of the following additional elements in any combination:

Element A1: Wherein the chemical bonding is selected from the group consisting of atomic layer deposition, chemical vapor deposition, and any combination thereof.

Element A2: Wherein the coating material is selected from the group consisting of aluminum oxide, titanium oxide, hafnium(IV) oxide, zirconium oxide, beryllium oxide, silicon carbide, silicon nitride, and any combination thereof.

Element A3: Wherein the chemical bonding is atomic layer deposition and the coating material is an aluminum oxide.

Element A4: Wherein the coating material is selected from the group consisting of diamond, diamond-like carbon, and any combination thereof.

Element A5: Wherein the coating material is coated at least partially onto at least one of the first and/or second metal surfaces at a thickness of less than the seal tolerance of the metal-to-metal seal.

Element A6: Wherein the coating material is coated at least partially onto at least one of the first and/or second metal surfaces to achieve the seal tolerance of the metal-to-metal seal.

Element A7: Wherein the first and/or second metal surfaces are at least partially coated with a seed layer.

Element A8: Wherein the coating material is coated in laminate layers.

Element A9: Wherein the coating material increases the durability of the metal-to-metal seal.

Element A10: Wherein the oilfield tool is a formation tester.

Element A11: Wherein the oilfield tool is a formation tester used as part of a production system.

Element A12: Wherein the oilfield tool is a formation tester that is wireline deployable.

By way of non-limiting example, exemplary combinations applicable to Embodiment A include: A1-A12; A1, A4, and A11; A6, A7, and A19; A9 and A10; A2, A5, A8, and A12; A3 and A5; A4 and A12; A10, A11, and A12; and the like.

Embodiment B

A method comprising: introducing an oilfield tool into a subterranean formation, the oilfield tool having a metal-to-metal seal formed between a first metal surface and a second metal surface, wherein the at least one of first and second metal surfaces are at least partially coated by chemical bonding or physical deposition of a coating material that is more durable and has a lower coefficient of friction than either or both of the first and/or second metal surfaces to which the coating material is applied; and performing an oilfield operation.

Embodiment B may have one or more of the following additional elements in any combination:

Element B1: Wherein the chemical bonding is selected from the group consisting of atomic layer deposition, chemical vapor deposition, and any combination thereof.

Element B2: Wherein the coating material is selected from the group consisting of aluminum oxide, titanium oxide, hafnium(IV) oxide, zirconium oxide, beryllium oxide, silicon carbide, silicon nitride, and any combination thereof.

Element B3: Wherein the chemical bonding is atomic layer deposition and the coating material is an aluminum oxide.

Element B4: Wherein the coating material is selected from the group consisting of diamond, diamond-like carbon, and any combination thereof.

Element B5: Wherein the coating material is coated at least partially onto at least one of the first and/or second metal surfaces at a thickness of less than the seal tolerance of the metal-to-metal seal.

Element B6: Wherein the coating material is coated at least partially onto at least one of the first and/or second metal surfaces to achieve the seal tolerance of the metal-to-metal seal.

Element B7: Wherein the first and/or second metal surfaces are at least partially coated with a seed layer.

Element B8: Wherein the coating material is coated in laminate layers.

Element B9: Wherein the coating material increases the durability of the metal-to-metal seal.

Element B10: Wherein the oilfield tool is a formation tester.

Element B11: Wherein the oilfield tool is a formation tester used as part of a production system.

Element B12: Further comprising introducing the oilfield tool through or on a tubular string.

Element B13: Further comprising introducing the oilfield tool using a wireline.

By way of non-limiting example, exemplary combinations applicable to Embodiment B include: B1-B13; B4 and B13; B2, B3, B6, and B9; B1 and B8; B6, B7, and B10; B11 and B13; B4, B5, and B9; B1, B6, and B11; B3 and B4; and the like.

Embodiment C

A system comprising: a tool assembly extending into a subterranean formation, the tool assembly having an oilfield tool having a metal-to-metal seal formed between a first metal surface and a second metal surface, wherein the at least one of the first and second metal surfaces are at least partially coated by chemical or physical bonding or physical deposition of a coating material that is more durable and has a lower coefficient of friction than either or both of the first and/or second metal surfaces to which the coating material is applied.

Embodiment C may have one or more of the following additional elements in any combination:

Element C1: Wherein the chemical bonding is selected from the group consisting of atomic layer deposition, chemical vapor deposition, and any combination thereof.

Element C2: Wherein the coating material is selected from the group consisting of aluminum oxide, titanium oxide, hafnium(IV) oxide, zirconium oxide, beryllium oxide, silicon carbide, silicon nitride, and any combination thereof.

Element C3: Wherein the chemical bonding is atomic layer deposition and the coating material is an aluminum oxide.

Element C4: Wherein the coating material is selected from the group consisting of diamond, diamond-like carbon, and any combination thereof.

Element C5: Wherein the coating material is coated at least partially onto at least one of the first and/or second metal surfaces at a thickness of less than the seal tolerance of the metal-to-metal seal.

Element C6: Wherein the coating material is coated at least partially onto at least one of the first and/or second metal surfaces to achieve the seal tolerance of the metal-to-metal seal.

Element C7: Wherein the first and/or second metal surfaces are at least partially coated with a seed layer.

Element C8: Wherein the coating material is coated in laminate layers.

Element C9: Wherein the coating material increases the durability of the metal-to-metal seal.

Element C10: Wherein the oilfield tool is a formation tester.

Element C11: Wherein the oilfield tool is a formation tester used as part of a production system.

Element C12: Further comprising a tubular string extending into the subterranean formation, and the oilfield tool contained within the tubular string.

Element C13: Further comprising a tubular string extending into the subterranean formation, and the oilfield tool conveyable on a wireline.

By way of non-limiting example, exemplary combinations applicable to Embodiment C include: C1-C13; C2, C4, C5, C10, and C13; C3 and C5; C6, C7, C8, and C12; C10 and C11; C5, C8, and C10; C12 and C13; C1, C83, and C8; and the like.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. An oilfield tool comprising:
a metal-to-metal seal formed between a first metal surface and a second metal surface, wherein at least one of the first and second metal surfaces is coated by at least a first layer of a coating material deposited by at least one of physical vapor deposition and chemical vapor deposition, wherein the chemical vapor deposition comprises atomic layer deposition,
wherein the coating material has a higher durability than at least one of the first and second metal surfaces to which the coating material is applied,
and wherein a coefficient of friction between the coating material and at least one of the first and second metal surfaces is lower than a coefficient of friction between the first metal surface and the second metal surface.

2. The oilfield tool of claim 1, wherein the coating material comprises at least one of aluminum oxide, titanium oxide, hafnium(IV) oxide, zirconium oxide, beryllium oxide, silicon carbide, silicon nitride, diamond, and diamond-like carbon.

3. The oilfield tool of claim 1, wherein the coating material is coated onto at least one of the first and second metal surfaces at a thickness of less than the seal tolerance of the metal-to-metal seal.

4. The oilfield tool of claim 1, wherein the coating material is coated onto at least one of the first and second metal surfaces to achieve the seal tolerance of the metal-to-metal seal.

5. The oilfield tool of claim 1, further comprising a seed layer, wherein at least one of the first and second metal surfaces is at least partially coated with the seed layer.

6. The oilfield tool of claim 1, further comprising a plurality of laminate layers coating the first layer of the coating material.

7. The oilfield tool of claim 1, wherein the coating material increases the durability of the metal-to-metal seal.

8. The oilfield tool of claim 1, wherein the coating material has a higher durability than at least one of the first and second metal surfaces based on at least one of hardness, stiffness, Poisson's ratio, and chemical durability of the coating material and the first and second metal surfaces.

9. A method comprising:
introducing an oilfield tool into a subterranean formation, the oilfield tool comprising a metal-to-metal seal formed between a first metal surface and a second metal surface,
wherein at least one of the first and second metal surfaces is coated by at least a first layer of a coating material deposited by at least one of physical vapor deposition and chemical vapor deposition, wherein the chemical vapor deposition comprises atomic layer deposition,
wherein the coating material has a higher durability than at least one of the first and second metal surfaces to which the coating material is applied, and wherein a coefficient of friction between the coating material and at least one of the first and second metal surfaces is lower than a coefficient of friction between the first metal surface and the second metal surface; and performing an oilfield operation.

10. The method of claim 9, wherein the coating material comprises at least one of aluminum oxide, titanium oxide, hafnium(IV) oxide, zirconium oxide, beryllium oxide, silicon carbide, silicon nitride, diamond, and diamond-like carbon.

11. The method of claim 9, wherein the coating material has a higher durability than at least one of the first and second metal surfaces based on at least one of hardness, stiffness, Poisson's ratio, and chemical durability of the coating material and the first and second metal surfaces.

12. The method of claim 9, wherein the coating material is deposited onto at least one of the first and second metal surfaces at a thickness of less than a seal tolerance of the metal-to-metal seal or to achieve the seal tolerance of the metal-to-metal seal.

13. A system comprising:
a tool assembly extending into a subterranean formation, the tool assembly having an oilfield tool comprising a metal-to-metal seal formed between a first metal surface and a second metal surface,
wherein at least one of the first and second metal surfaces is coated by at least a first layer of a coating material deposited by at least one of physical vapor deposition and chemical vapor deposition, wherein the chemical vapor deposition comprises atomic layer deposition,
wherein the coating material has a higher durability than at least one of the first and second metal surfaces to which the coating material is applied,
and wherein a coefficient of friction between the coating material and at least one of the first and second metal surfaces is lower than a coefficient of friction between the first metal surface and the second metal surface.

14. The system of claim 13, wherein the tool assembly comprises a formation tester.

15. The system of claim 13, wherein the coating material comprises at least one of aluminum oxide, titanium oxide, hafnium(IV) oxide, zirconium oxide, beryllium oxide, silicon carbide, silicon nitride, diamond, and diamond-like carbon.

16. The system of claim 13, further comprising at least one of a seed layer and a plurality of laminate layers, wherein at least one of the first and second metal surfaces is at least partially coated with the at least one of the seed layer and the plurality of laminate layers.

17. The system of claim 13, wherein the coating material has a higher durability than at least one of the first and second metal surfaces based on at least one of hardness, stiffness, Poisson's ratio, and chemical durability of the coating material and the first and second metal surfaces.

18. A method comprising:
depositing, onto at least one of a first metal surface and a second metal surface, at least a first layer of a coating material by at least one of chemical vapor deposition and physical vapor deposition, wherein depositing the first layer of the coating material by chemical vapor deposition comprises depositing the first layer of the coating material by atomic layer deposition,
wherein the coating material has a higher durability than the at least one of the first metal surface and the second metal surface,
and wherein a coefficient of friction between the coating material and the at least one of the first metal surface and the second metal surface is lower than a coefficient of friction between the first metal surface and the second metal surface; and
forming a metal-to-metal seal between the first metal surface and the second metal surface.

19. The method of claim 18, wherein depositing the first layer of the coating material by physical vapor deposition comprises depositing the first layer of the coating material by electron beam deposition.

20. The method of claim 18, wherein the coating material comprises at least one of aluminum oxide, titanium oxide, hafnium(IV) oxide, zirconium oxide, beryllium oxide, silicon carbide, silicon nitride, diamond, and diamond-like carbon.

21. The method of claim 18, wherein the coating material has a higher durability than at least one of the first and second metal surfaces based on at least one of hardness, stiffness, Poisson's ratio, and chemical durability of the coating material and the first and second metal surfaces.

22. The method of claim 18, further comprising applying a seed layer to at least one of the first and second metal surfaces.

23. The method of claim 18, wherein depositing the first layer of the coating material comprises depositing the first layer of the coating material onto at least one of the first and second metal surfaces at a thickness of less than a seal tolerance of the metal-to-metal seal or to achieve the seal tolerance of the metal-to-metal seal.

* * * * *